United States Patent
Ählig et al.

[11] Patent Number: 6,115,229
[45] Date of Patent: Sep. 5, 2000

[54] APPARATUS FOR IDENTIFYING THE POSITION OF AN ELEMENT, IN PARTICULAR A LOCK BOLT OF A MOTOR VEHICLE LOCK, WHICH CAN BE MOVED BETWEEN TWO END POSITIONS, AND A METHOD OF DRIVING THE APPARATUS

[75] Inventors: Uwe Ählig, Maxhütte-Haidhof; Reiner Buchner, Sinzing; Manfred Glehr, Neutraubling, all of Germany

[73] Assignee: Siemens Aktiengesellschaft, Munich, Germany

[21] Appl. No.: 09/239,420

[22] Filed: Jan. 28, 1999

[30] Foreign Application Priority Data

Jan. 28, 1998 [DE] Germany ............................ 198 03 187

[51] Int. Cl.$^7$ .................................................. H01H 47/00
[52] U.S. Cl. ............................................ 361/179; 361/180
[58] Field of Search ................................... 361/179, 170, 361/180

[56] References Cited

U.S. PATENT DOCUMENTS 4,543,527   9/1985   Schuchmann et al. ................. 324/207
4,968,953  11/1990   Kanda et al. ............................. 331/65

FOREIGN PATENT DOCUMENTS

| | | | |
|---|---|---|---|
| 0170723B1 | 2/1986 | European Pat. Off. | G01D 5/14 |
| 4021164C1 | 11/1991 | Germany | H03K 17/95 |
| 4141264C1 | 3/1993 | Germany | G01D 5/20 |
| 4417824A1 | 11/1995 | Germany | G01D 5/20 |
| 4427990A1 | 2/1996 | Germany | G01B 7/14 |
| 4429314A1 | 2/1996 | Germany | H03K 17/95 |
| 676147A5 | 12/1990 | Switzerland | G01B 7/02 |

Primary Examiner—Stephen W. Jackson
Attorney, Agent, or Firm—Herbert L. Lerner; Laurence A. Greenberg; Werner H. Stemer

[57] ABSTRACT

In order to identify the position of a movable element, such as a lock bolt, a resonant circuit is subjected to the element or a part that moves with the element. The resonant circuit is thereby damped by the element in a position-dependent manner and oscillates in one end position of the element but is damped too greatly in the other end position. A microprocessor controls the switching on and the respective operating point of a transistor in such a way that switching hysteresis is obtained. The operating point can be automatically readjusted in an adaptation phase.

18 Claims, 2 Drawing Sheets

APPARATUS FOR IDENTIFYING THE POSITION OF AN ELEMENT, IN PARTICULAR A LOCK BOLT OF A MOTOR VEHICLE LOCK, WHICH CAN BE MOVED BETWEEN TWO END POSITIONS, AND A METHOD OF DRIVING THE APPARATUS

BACKGROUND OF THE INVENTION

Field of the Invention

The invention relates to an apparatus for identifying the position of an element that can be moved between two end positions. In particular, the element may be a lock bolt of a motor vehicle lock, e.g. of a door lock, steering wheel lock or filler cap lock. Furthermore, the invention is directed at a method of operating such an apparatus.

In the automotive technology it is often desired to be able to detect an actual locking state/unlocking state of a motor vehicle lock in order, for example, to activate or to deactivate immobilization. The lock position can be attained by checking the position of the lock bolt, which is in one of its two end positions in accordance with the respective lock state (open/locked).

However, in a great number of other cases there is also the requirement of being able to detect the respective position of an element which can be changed over selectively between two positions, in order that corresponding control measures can be implemented.

German patent DE 40 21 164 C1 essentially discloses an apparatus that is exemplified in a proximity switch. The apparatus identifies the position of an element, in particular a lock bolt of a motor vehicle lock, which can be moved between two end positions. The apparatus has a resonant circuit with a coil that can be influenced by the movable element or a part connected. A driver and evaluation circuit is connected to the coil and evaluates an oscillation parameter of the resonant circuit for the purpose of position identification. The proximity switch contains a transistor oscillator connected to two LC resonant circuits, one of which is damped in a position-dependent manner by the element to be detected.

Furthermore, DE 44 29 314 A1 discloses an inductive proximity switch having an oscillator, which feeds a transmission coil, and two sensor coils arranged in a differential connection, which are influenced to different extents by an approaching object and whose differential AC voltage is used to drive the oscillator. In order to obtain hysteresis, the tap between the two sensor coils can be connected to ground potential via a resistor and a switch, the switch being switched on or off in the event of a change in the oscillation state of the oscillator.

European patent EP 0 170 723 B1 discloses a position identification apparatus in which an element that can be moved between two or more positions is guided along at least one coil and contains alternating zones comprising ferromagnetic and electrically readily conductive zones. The coil or coils is/are fed with alternating current and is/are connected to an evaluation circuit for detecting the respective voltage drop across the coil or coils. However, the respective resultant voltage is dependent on external influencing factors, aging phenomena, guidance inaccuracies, etc., which affects the detection precision and/or the outlay on circuitry required to obtain sufficient measurement accuracy.

In quite a lot of cases, for example in the case of motor vehicle locks, it is sufficient to be able to distinguish in boolean accuracy, i.e., "digitally" between two states, that is to say between two positions of the movable element. Intermediate positions are traversed only during the positional changeover and do not have to be detected.

SUMMARY OF THE INVENTION

It is accordingly an object of the invention to provide an apparatus for identifying the position of an element which can be moved between two end positions, which overcomes the above-mentioned disadvantages of the heretofore-known devices and methods of this general type and which ensures proper position identification in conjunction with a simple structure and good functional reliability.

With the foregoing and other objects in view there is provided, in accordance with the invention, an apparatus for identifying a position of an element movable between two end positions, such as a lock bolt of a motor vehicle lock. The apparatus comprises:

- a resonant circuit including a coil disposed so as to be influenced by a position of a movable element;
- a transistor connected between a voltage supply and the resonant circuit for selectively switching a voltage supply of the resonant circuit on and off, the transistor having an operating point;
- a driver and evaluation circuit connected to the coil for evaluating an oscillation parameter of the resonant circuit and identifying a position of the movable element from the oscillation parameter;
- the driver and evaluation circuit, upon detecting a change in the oscillation parameter, adjusting an excitation of the resonant circuit for the purpose of obtaining hysteresis, by shifting the operating point of the transistor.

In accordance with an added feature of the invention, the driver and evaluation circuit has a microprocessor with an input terminal connected to the resonant circuit, a first output terminal for controlling a switching of the transistor, the output terminal being connected to a base of the transistor, and a second output terminal for generating a hysteresis control signal.

In accordance with an additional feature of the invention, a resistor is connected between the second output terminal and the base of the transistor.

In the invention, use is made of a resonant circuit (oscillator circuit) whose oscillation behavior is influenced by the respective position of the movable element. The movable element can alter, in a position-dependent manner, the present inductance of the coil, the losses of the resonant circuit and/or—in the case of an inductively coupled positive feedback circuit (for example a Meissner circuit)—the turns ratio (coupling factor) and, consequently, perform position-dependent damping of the coil, and hence of the resonant circuit. The damping, which differs greatly in the two end positions of the movable element, can be detected by the evaluation circuit by the latter monitoring an oscillation parameter. The oscillation parameter may be the oscillation amplitude, the oscillation frequency or else the presence/absence of the oscillations. When the movable element is in one end position for example remote from the coil, the resonant circuit can oscillate essentially in an undamped manner. When the position of the movable element is then changed over and the element is moved into the vicinity of the coil, however, the damping is considerably greater, with the result that the oscillation amplitude becomes smaller or the oscillation of the resonant circuit even completely ceases, or a clearly detectable resonant frequency shift is established.

Consequently, the checking of the oscillation parameter allows reliable identification of the position of the movable element, for example the lock bolt, in conjunction with a simple, robust structure.

The use of a transistor allows the resonant circuit and, if appropriate, the entire evaluation circuit to be switched off, thereby minimizing the current consumption in quiescent phases. Furthermore, the use of the transistor attains forced hysteresis as a result of operating point adjustment. The transistor thus performs a double function.

The functional reliability of the apparatus according to the invention is increased by the hysteresis that is provided, which makes it possible to ensure that in the region of the switching boundary, that is to say the changeover between oscillations present/not present or lock unlocked/locked, oscillation between the on and off state of the output signal that signals the lock open state does not occur.

In accordance with another feature of the invention, a capacitor (coupling capacitance) is connected between the input terminal and the resonant circuit. This coupling capacitance blocks d.c. voltages and permits only the a.c. signal indicating the presence of oscillations to pass to the microprocessor.

In accordance with a further feature of the invention, a high-value resistor is connected in parallel to the capacitor.

In accordance with again another feature of the invention, a capacitor is connected between the second output terminal and ground. The interference immunity is improved by connecting a capacitance to the microprocessor output terminal which controls the hysteresis. The output capacitance filters out interference.

In accordance with again an added feature of the invention, a low-pass filter is connected to the microprocessor. The microprocessor generates a pulse signal with a variable duty ratio smoothed by the low-pass filter.

In accordance with again an additional feature of the invention, the transistor has a collector-emitter path, and a resistor is connected in series with the collector-emitter path of the transistor. Preferably, the resistor is a variable resistor.

In accordance with again a further feature of the invention, the resonant circuit is tuned to oscillate in one end position of the movable element and not to oscillate in another end position of the movable element, and wherein the driver and evaluation circuit detects a presence or an absence of the oscillations as the oscillation parameter.

In accordance with yet an added feature of the invention, the oscillation parameter is the oscillation amplitude or the oscillation frequency.

It is thus possible to configure the microprocessor such that it generates at one output a pulse signal with an adjustable duty ratio, that is to say a pulse width-modulated signal, which is converted into a voltage with an amplitude dependent on the degree of modulation by means of the low-pass filter. This voltage can serve as driver voltage for the transistor, so that the operating point of the latter can be shifted in dependence on the degree of modulation. This permits readjustment of the driving of the transistor in such a way that the two oscillation states "oscillation present" and "oscillation ended" can be clearly assigned to the two end positions of the movable element. As a result of this, it is possible automatically to compensate for influences on account of aging processes, temperature fluctuations or mechanical deformations such as, for instance, buckling of a pick-up lug which is arranged on the movable element and moves along the resonant circuit coil.

Since the resonant circuit can be adjusted, it is also possible to compensate for manufacturing tolerances, for example by the operating point of the transistor being correspondingly shifted.

With the above and other objects in view there is also provided, in accordance with the invention, a method of driving the apparatus for identifying a position of the movable element. The apparatus comprises a resonant circuit including a coil disposed so as to be influenced by a position of the movable element, a transistor connected to selectively switch a voltage supply of the resonant circuit on and off, and a driver and evaluation circuit connected to the coil for evaluating an oscillation parameter of the resonant circuit and identifying a position of the movable element from the oscillation parameter. The method comprises the following steps:

a) while the movable element is in a known position, adjusting an excitation of the resonant circuit until an oscillation state of the resonant circuit changes; and b) altering the excitation opposite to an adjustment direction in step a) until the oscillation state present prior to the adjustment reoccurs, and storing the current excitation quantity as a new setpoint value for a future excitation of the resonant circuit.

In accordance with yet again another feature of the invention, the movable element is actuated after step b) such that the movable element is moved to the opposite end position and a renewed change in the oscillation state is thereby caused.

In accordance with yet again a further feature of the invention, the transistor is driven with a driver or control voltage that is variable in ramped fashion.

In accordance with a concomitant feature of the invention, the variable driver or control voltage is generated with a pulse width-modulated signal with a variable duty ratio and conducted via a smoothing element, such as a low-pass filter.

In sum, the method enables automatic, reliable adjustment and therefore allows automatic readjustment even in the event of change tendencies influenced by aging, storage problems, ambient influences or other variables.

Other features which are considered as characteristic for the invention are set forth in the appended claims.

Although the invention is illustrated and described herein as embodied in an apparatus for identifying the position of an element, in particular a lock bolt of a motor vehicle lock, which can be moved between two end positions, and method for driving such an apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
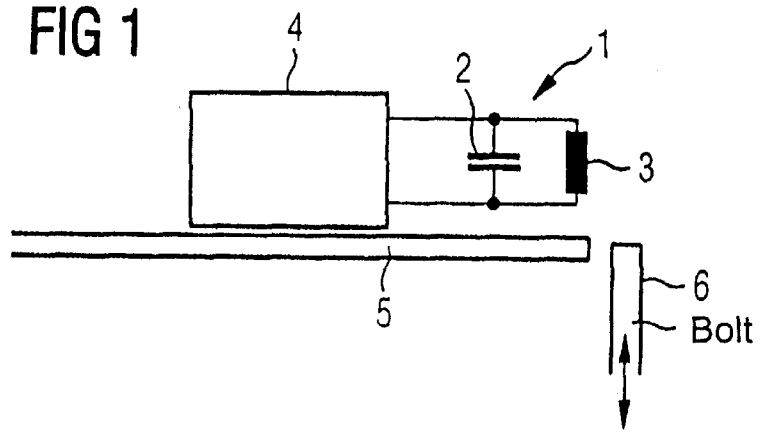
FIG. 1 is a diagrammatic view of a basic apparatus according to the invention.

Referring now to the figures of the drawing in detail and first, particularly, to FIG. 1 thereof, there is seen a novel position identification apparatus illustrated in basic diagram. The apparatus has a resonant circuit 1 and a driver and evaluation circuit 4 connected thereto. The resonant circuit 1 is constructed as a parallel resonant circuit with a capacitor 2 and a coil 3. An element 6, such as a lock bolt of a motor vehicle lock, can be moved between two end positions as indicated by the double arrow. The element 6 is illustrated in its lower, for example locked, end position in FIG. 1. The element 6 may be formed directly by the lock bolt, which is composed of ferromagnetic material, for example, or by a magnetically effective part, for example a ferrite, a permanent magnet, etc., which is fitted on the lock bolt. In the lower end position illustrated in FIG. 1, the resonant circuit 1 is shielded with respect to the element 6 by a metal plate 5, which may be formed for example by a motor vehicle door panel or stabilizing plate. The element 6 therefore has no effect on the resonance behavior of the resonant circuit 1. However, when the lock bolt is displaced into its upper end position in the direction of the arrow as a result of the lock being unlocked or locked, then the element comes to lie opposite the coil 3 and therefore distinctly influences the resonant behavior of the resonant circuit 1. As a result of this, the damping of the resonant circuit is greatly increased, so that the oscillations completely cease or, at the very least, a great amplitude attenuation and/or oscillation frequency shift is established.

The driver and evaluation circuit 4 monitors the corresponding oscillation parameter and can reliably detect the change therein. The circuit 4 can thus feed a signal "lock locked" or "lock unlocked" to the on-board electronic unit, for example an immobilization control unit. Since no intermediate positions of the movable element are permanently assumed, the generation of a digital output signal "locked/unlocked" is sufficient.

In the apparatus according to the invention, the resonant circuit, the coil thereof, or the positive feedback in the resonant circuit, is influenced in a clearly detectable manner by the mechanical position of the movable element 6 and the magnetic properties thereof, which differ from the surroundings. In general, it holds true for the parallel resonant circuit 1 that depending on the degree of damping (weakly, critically, greatly damped), either an increasing oscillation, a constant oscillation, or an even greatly decreasing oscillation is generated. In order that the resonant circuit (oscillator) can start to oscillate, the damping must be less than zero during the oscillation-starting phase, this being achieved by a negative resistance. The negative resistance can be built up with the aid of an active component, for example a transistor. Known circuits that can be used for this purpose are, for example, a Meissner circuit, a Colpitts circuit, or the like.

Figure 2:
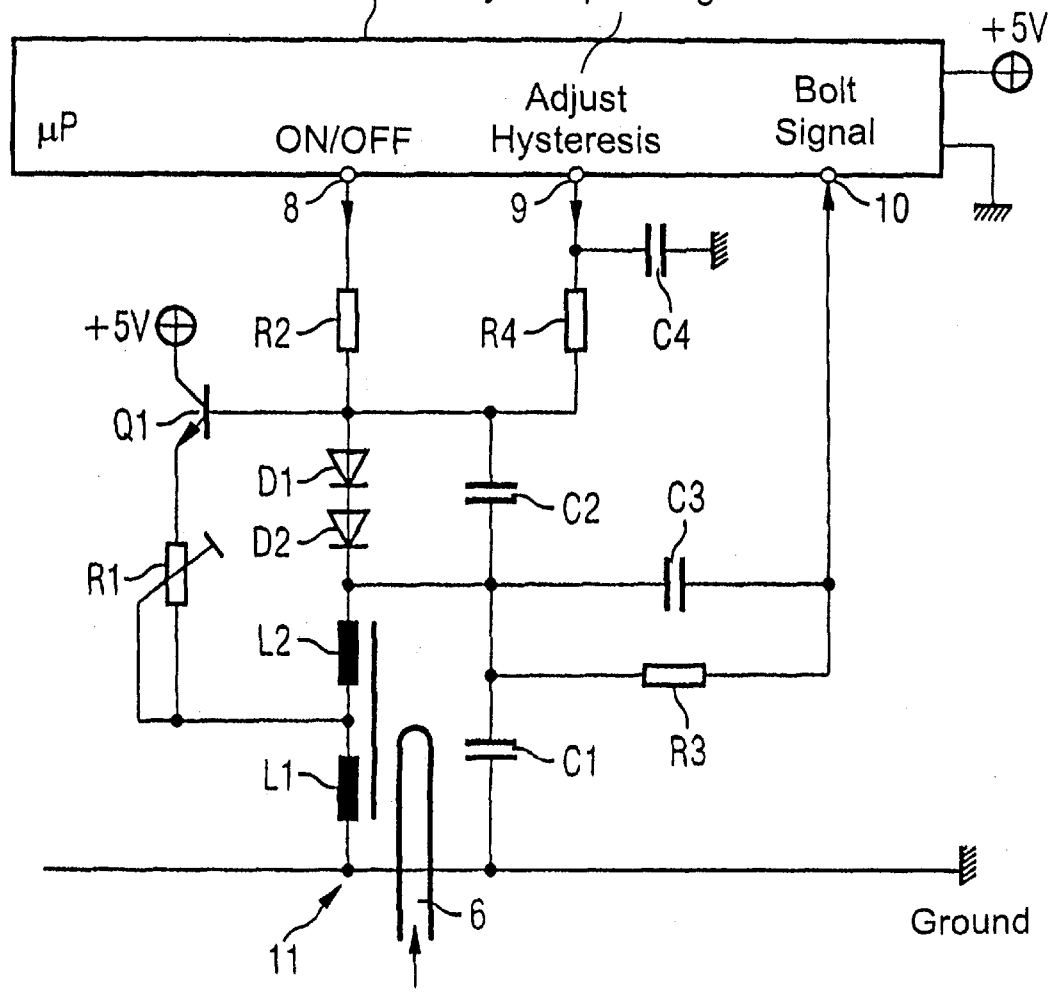
FIG. 2 is a schematic view of an exemplary embodiment of the position identification apparatus according to the invention.

FIG. 2 illustrates a first exemplary embodiment of the position identification apparatus according to the invention in greater detail. A microprocessor ($\mu$p) 7 forms the driver and evaluation circuit of the position identification device The microprocessor 7 has a first output terminal 8, at which the switch-on and switch-off signal for activating and deactivating the position identification apparatus is output, a second output terminal 9, at which an output signal serving to generate hysteresis is output, and an input terminal 10, at which the signal that mirrors the element position, for example the bolt position signal, is received. The microprocessor 7 is connected in a customary manner to a voltage supply of, say, +5 V and ground. A switch in the form of a transistor $Q_1$ is connected in a common-collector connection and its base is connected, on the one hand, via a resistor $R_2$ to the output terminal 8 and, on the other hand, via a resistor $R_4$ to the output terminal 9. The emitter of the transistor $Q_1$ is connected, via a variable resistor $R_1$ serving to set the operating point, to a resonant circuit 11. The resonant circuit is a parallel oscillating circuit with two series-connected, magnetically coupled coils $L_1$, $L_2$ and a capacitor $C_1$ connected in parallel with the coils. The coils $L_1$, $L_2$ form an autotransformer with a tap to which the transistor $Q_1$ is connected via the resistor $R_1$. The lock bolt 6 or an element coupled thereto is moved parallel to the magnetically coupled coils $L_1$, $L_2$ in the manner illustrated in FIG. 2 and, consequently, alters the magnetic damping of the resonant circuit 11 in a position-dependent manner. Connected between the base terminal of the transistor and the resonant circuit 11 is a series circuit formed by two diodes $D_1$, $D_2$, which serve, on the one hand, to define the base-emitter voltage (on the basis of their forward voltage drop) and, moreover, effect a stabilization of the operating point together with the resistor $R_1$. In terms of a.c. voltage, the two diodes $D_1$, $D_2$ are bridged by a capacitor $C_2$ connected in parallel, the capacitor connecting the transistor base and the resonant circuit 11 to one another in terms of a.c. voltage.

A capacitor $C_3$ is connected between that terminal of the resonant circuit 11 which is not grounded and the input terminal 10 of the microprocessor 7. A high-value resistor $R_3$ can be connected in parallel with the capacitor $C_3$ for the purpose of stabilizing the operating point.

The circuit shown in FIG. 2 operates as follows: In order to activate the position identification apparatus, the microprocessor 7 changes over its output terminal 8 to high level, with the result that base current flows to the transistor $Q_1$ via the resistor R2 and turns the transistor on.

When the transistor $Q_1$ is turned on and the lock bolt 6 (or the pick-up part connected thereto) is arranged remote from the coil $L_1$ or $L_2$, the resonant circuit 11 is hardly damped and starts to oscillate and, finally, reaches a stable oscillation state (substantially undamped steady state oscillation). The oscillations of the resonant circuit 11 are conducted via capacitor $C_3$ as a.c. voltage signal to the terminal 10 of the microprocessor 7, with the result that the microprocessor 7 recognizes that the resonant circuit 11 is oscillating, that is to say that the movable element (lock bolt) 6 is in one end position, for example in the locked end position. At an output which is not illustrated, the microprocessor 7 generates a digital output signal which signals this lock state and/or effects lock state-dependent control. Furthermore, the microprocessor 7 activates the output terminal 9, that is to say puts the latter at high level. As a result, additional base current now flows to the transistor $Q_1$ via the resistor $R_4$, with the result that the operating point thereof is adjusted. The resistor $R_4$ has a very much higher resistance than the resistor $R_2$ (for example 30 times the resistance), with the result that the additional base current flowing via the resistor $R_4$ is orders of magnitude less than the base current fed in via the resistor $R_2$. As a result of the additional base current, the operating point of the transistor is shifted somewhat in the direction of a higher emitter current, that is to say toward easier oscillation of the resonant circuit 11.

If the movable element 6 is then changed over to its other end position, the damping of the resonant circuit 11 becomes considerably higher, with the result that the oscillation of the resonant circuit 11 breaks off or, at the very least, the oscillation amplitude becomes smaller or the frequency is shifted. Consequently, either no signal or only a considerably weaker or frequency-shifted signal appears at the input terminal 10 of the microprocessor 7, with the result that the microprocessor 7 recognizes from this that the movable element has been changed over to the other end position. As a reaction to this, the microprocessor 7 changes over the position indicating signal or control signal output at its output which is not illustrated, with the result that the lock state change is communicated to the further units and the appropriate units are correspondingly changed over.

Furthermore, as a reaction to the signal change at the input terminal 10, the microprocessor 7 switches off its hysteresis output terminal 9, with the result that no more additional base current is provided. The operating point is thus brought back to the earlier value with a diminished oscillation tendency of the resonant circuit 11. Consequently, a hysteresis effect is obtained by the changeover of the output terminal 9.

A capacitor (filter capacitor) $C_4$ may be connected between the output terminal 9 and ground for the purpose of keeping away interference. The effect simultaneously achieved by the capacitor $C_4$ is that the additional base current does not rise and fall abruptly but rather exponentially. Instead of the series-connected coils $L_1$ and $L_2$, the resonant circuit 11 can also have just a single coil which is connected in parallel with the capacitor $C_1$. Furthermore, the series circuit formed by the diodes $D_1$, $D_2$ may also be replaced by a single diode or by another functionally equivalent element. Furthermore, a rectifier element and smoothing element, and if appropriate an additional threshold value element, can be connected upstream of the input terminal 10 of the microprocessor 7, with the result that the signal present at the input terminal 10 is merely a digital signal having two levels, which can be interrogated and evaluated by the microprocessor 7 in a particularly simple manner.

For power saving purposes, the transistor $Q_1$ can be switched on and off at specific intervals via the output terminal 8, in which case the intervals may be regular or may be defined as a function of specific influencing variables, for example when the motor vehicle is being driven. As long as the transistor $Q_1$ is switched off, the entire position identification apparatus, with the exception of the microprocessor 7, is put into a deenergized state, with the result that the current consumption in the quiescent phases is minimal.

Figure 3:
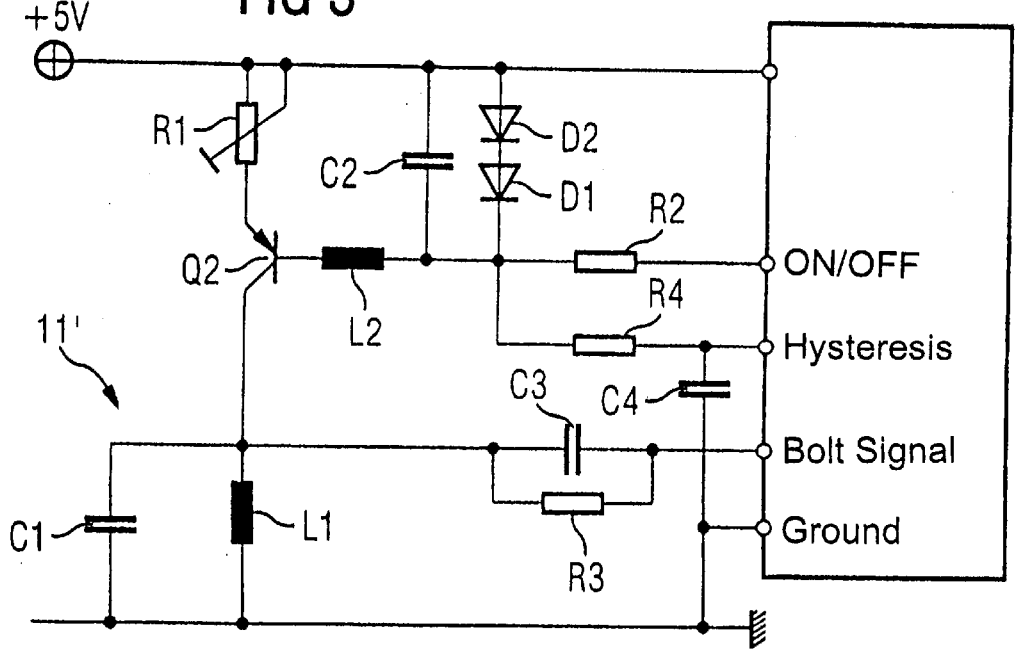
FIG. 3 is a schematic view of a further exemplary embodiment with a transistor connected in a common-collector connection.

FIG. 3 shows a further exemplary embodiment of the position identification apparatus according to the invention, in which instead of the npn transistor $Q_1$ connected up in a common-collector connection in accordance with FIG. 1, a common-emitter pnp transistor $Q_2$ is used. In this exemplary embodiment, the emitter of the transistor $Q_2$ is connected to the voltage supply (for example +5 V) via the variable resistor $R_1$, while the collector is connected to a parallel resonant circuit 11' having a single coil L1 and a capacitor $C_1$ connected in parallel therewith. The parallel circuit formed by the capacitor $C_2$ and the diode series circuit $D_1$, $D_2$ is connected between the voltage supply and the base of the transistor $Q_2$. Otherwise the circuit according to FIG. 3 essentially corresponds to the circuit shown in FIG. 2 in respect of structure and method of operation. Oscillation is enabled by means of the positive feedback coil $L_2$.

The effect achieved by the circuit shown in FIG. 3, in particular the common-emitter pnp transistor $Q_2$, is that the useful voltage at the input terminal 10, which is coupled to the resonant circuit via the capacitor (coupling capacitor) $C_3$ and the resistor $R_3$, moves about the zero point. It is not necessary, therefore, to perform additional potential shifting.

Figure 4:
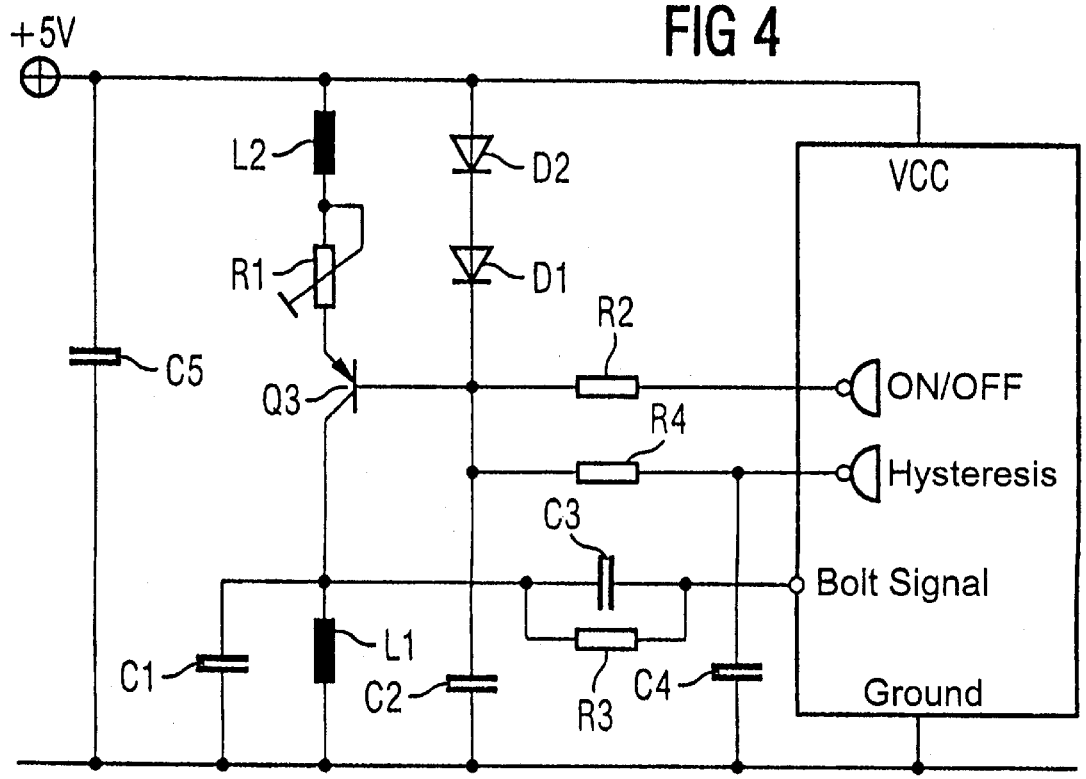
FIG. 4 is a schematic view of another exemplary embodiment with a transistor connected in a common-base connection.

FIG. 4 illustrates a further embodiment, in which a commonbase pnp transistor $Q_3$ is used. In terms of circuitry, the circuit shown in FIG. 4 differs from the circuit according to FIG. 3 essentially to the effect that a coil $L_2$ is provided in the emitter path in series with the variable resistor $R_1$, which coil is magnetically coupled to the coil $L_1$. Furthermore, the capacitor $C_2$ is connected between the base terminal of the transistor $Q_3$ and ground potential in the case of the circuit according to FIG. 4. Moreover, a capacitor $C_5$ serving the purpose of stabilization is connected between the positive voltage supply (for example 5 V) and ground. It goes without saying that this capacitor can also be provided in the exemplary embodiments shown in FIGS. 2 and 3. The circuit shown in FIG. 4 is distinguished by good linearity in the setting of the operating point on account of the series-connected resistor $R_1$.

In the exemplary embodiments shown in FIGS. 2 to 4, furthermore, it is possible to provide automatic adaptation of the operating point. This adaptation can be carried out for example at predetermined time intervals or each time the apparatus is switched on or else in each case after a specific number of switch-on instances during an initial operating phase. For this purpose, a variable control or driver voltage is applied to the transistor $Q_1$, $Q_2$ or $Q_3$, which voltage is increased in ramped or stepped fashion. The variable voltage is achieved for example by virtue of the fact that one output of the microprocessor 7, for example the output terminal 8, is operated with a pulse width-modulated output signal with a variable duty ratio. In that case, a smoothing element, for example an RC element as low-pass filter, is connected downstream of the output 8. If it is assumed that the lock bolt is in the closed position with the vehicle still locked, and the resonant circuit 11 is greatly damped as a result of this, the resonant circuit does not start to oscillate, so that no signal is built up at the input 10. The driver or control voltage for the transistor is then gradually increased, for example by gradually increasing the duty ratio of the pulse width-modulated signal, to be precise until (despite the lock bolt still being in the closed position) an oscillation occurs at the input terminal 10. The driver or control voltage of the transistor is subsequently reduced again (for example by reducing the duty ratio of the pulse width-modulated signal) to an extent such that the oscillations of the resonant circuit 11 break off. This means that the operating point of the transistor is now set to a value such that the resonant circuit, with the lock bolt in the closed position, still does not execute any oscillations but can rapidly start to oscillate in the event of a reduction in the damping. The motor for operating the lock (lock bolt) is subsequently activated, with the result that the lock bolt is moved to the unlocking position. As a result of this, the damping of the resonant circuit is greatly reduced, so that the resonant circuit starts to oscillate and executes stable oscillations. The driver or voltage value reached at the conclusion of the adaptation phase is then stored for the future control of the transistor until the next adaptation phase.

The effect achieved by this procedure is that the operating point is always automatically set to a position such that a distinction can clearly be made between locked and unlocked position. This adaptation operation can be carried out repeatedly for each defined known state of the bolt (for example locking state). This automatic adaptation enables the long-term functional reliability of the apparatus according to the invention to be improved, since it is possible automatically to compensate for, for example, aging processes, temperature fluctuations or mechanical faults, for example positional faults of the lock bolt or the magnetically effective components connected thereto.

To summarize, the circuit according to the invention constitutes an oscillator circuit which can be switched on and off, has hysteresis, is controlled and evaluated by a microprocessor and is equipped with a dampable resonant circuit (oscillator).

The invention can be used in a multiplicity of systems in which it is necessary to identify the respective end position of a movable element, and which provide corresponding control measures as a function of the respective position. This may involve, for example, the control of an electronic steering lock, of an ignition starting interlock or electronic ignition interlock, locks and interlocks of a general nature, etc.

In general, the invention provides contactless position identification with a readjustment possibility (for example via the variable resistor $R_1$ or by means of the above-described automatic adaptation of the operating point).

We claim:

1. An apparatus for identifying a position of an element movable between two end positions, comprising:

a resonant circuit including a coil disposed so as to be influenced by a position of a movable element;

a transistor connected between a voltage supply and said resonant circuit for selectively switching a voltage supply of said resonant circuit on and off, said transistor having an operating point;

a driver and evaluation circuit connected to said coil for evaluating an oscillation parameter of said resonant circuit and identifying a position of the movable element from the oscillation parameter;

said driver and evaluation circuit, upon detecting a change in the oscillation parameter, adjusting an excitation of said resonant circuit for the purpose of obtaining hysteresis, by shifting the operating point of said transistor.

2. The apparatus according to claim 1, wherein said movable element is a lock bolt of a motor vehicle lock.

3. The apparatus according to claim 1, wherein said driver and evaluation circuit has a microprocessor with an input terminal connected to said resonant circuit, a first output terminal for controlling a switching of said transistor, said output terminal being connected to a base of said transistor, and a second output terminal for generating a hysteresis control signal.

4. The apparatus according to claim 3, which further comprises a resistor connected between said second output terminal and the base of said transistor.

5. The apparatus according to claim 3, which further comprises a capacitor connected between said input terminal and said resonant circuit.

6. The apparatus according to claim 5, which further comprises a high-value resistor connected in parallel to said capacitor.

7. The apparatus according to claim 3, which comprises a capacitor connected between said second output terminal and ground.

8. The apparatus according to claim 3, which further comprises a low-pass filter connected to said microprocessor, and wherein said microprocessor generates a pulse signal with a variable duty ratio smoothed by said low-pass filter.

9. The apparatus according to claim 1, wherein said transistor has a collector-emitter path, and including a resistor connected in series with said collector-emitter path of said transistor.

10. The apparatus according to claim 9, wherein said resistor is a variable resistor.

11. The apparatus according to claim 1, wherein said resonant circuit is tuned to oscillate in one end position of the movable element and not to oscillate in another end position of the movable element, and wherein said driver and evaluation circuit detects a presence or an absence of the oscillations as the oscillation parameter.

12. The apparatus according to claim 1, wherein the oscillation parameter is an oscillation amplitude.

13. The apparatus according to claim 1, wherein the oscillation parameter is an oscillation frequency.

14. A method of driving an apparatus for identifying a position of an element movable between two end positions, wherein the apparatus comprises a resonant circuit including a coil disposed so as to be influenced by a position of the movable element, a transistor connected to selectively switch a voltage supply of said resonant circuit on and off, and a driver and evaluation circuit connected to the coil for evaluating an oscillation parameter of the resonant circuit and identifying a position of the movable element from the oscillation parameter, the method which comprises:

a) while the movable element is in a known position, adjusting an excitation of the resonant circuit until an oscillation state of the resonant circuit changes; and b) altering the excitation opposite to an adjustment direction in step a) until the oscillation state present prior to the adjustment reoccurs, and storing the current excitation quantity as a new setpoint value for a future excitation of the resonant circuit.

15. The method according to claim 14, which comprises actuating the movable element after step b) such that the movable element is moved to the opposite end position, and thereby causing a renewed change in the oscillation state.

16. The method according to claim 14, wherein steps a) and b) comprise driving the transistor with a driver or control voltage variable in ramped fashion.

17. The method according to claim 16, which comprises generating the variable driver or control voltage by a pulse width-modulated signal with a variable duty ratio and conducted via a smoothing element.

18. The method according to claim 17, wherein the smoothing element is a low-pass filter.

* * * * *